United States Patent
Stokar et al.

(10) Patent No.: US 11,874,347 B2
(45) Date of Patent: Jan. 16, 2024

(54) OPTIMALLY-SHAPED RF PULSE FOR MRI APPLICATIONS

(71) Applicant: Clear-Cut Medical Ltd., Rehovot (IL)

(72) Inventors: Saul Stokar, Raanana (IL); Tal Bareket, Tel Aviv (IL); Zachi Peles, Avihayil (IL)

(73) Assignee: Clear-Cut Medical Ltd., Rehovot (IL)

( * ) Notice: Subject to any disclaimer, the term of this patent is extended or adjusted under 35 U.S.C. 154(b) by 0 days.

(21) Appl. No.: 17/909,409

(22) PCT Filed: Mar. 17, 2021

(86) PCT No.: PCT/IB2021/052232
§ 371 (c)(1),
(2) Date: Sep. 5, 2022

(87) PCT Pub. No.: WO2021/191747
PCT Pub. Date: Sep. 30, 2021

(65) Prior Publication Data
US 2023/0111523 A1    Apr. 13, 2023

Related U.S. Application Data

(60) Provisional application No. 62/992,993, filed on Mar. 22, 2020.

(51) Int. Cl.
*G01R 33/34* (2006.01)
(52) U.S. Cl.
CPC .............. *G01R 33/34092* (2013.01)

(58) Field of Classification Search
CPC .................................. G01R 33/34092
See application file for complete search history.

(56) References Cited

U.S. PATENT DOCUMENTS

| 7,439,738 B2 * | 10/2008 | Pines ............ G01R 33/385 |
| | | 324/307 |
| 9,903,928 B2 * | 2/2018 | Snyder ......... G01R 33/4816 |
| 2001/0011889 A1 | 8/2001 | Golan |
| 2017/0003359 A1 | 1/2017 | Rosen et al. |

OTHER PUBLICATIONS

PCT Search Report and Written Opinion PCT/IB2021/052232, dated Jun. 21, 2021.
N. Boulant et al: "B1 and B0 inhomogeneity mitigation in the human brain at 7 T with selective pulses by using average Hamiltonian theory", Magnetic Resonance in Medicine, vol. 65, No. 3, Oct. 14, 2010 (Oct. 14, 2010), pp. 680-691, XP055031483, ISSN: 0740-3194, DOI: 10.1002/mrm.22658.

(Continued)

*Primary Examiner* — Gregory H Curran
(74) *Attorney, Agent, or Firm* — Dekel Patent Ltd.; David Klein

(57) ABSTRACT

A method for shaping an RF pulse for use with an MRI system includes shaping an RF pulse for use with an MRI system that uses an RF coil. The RF pulse is shaped to reduce changes in B1 amplitude and in an off-resonance effect with respect to Larmor frequency as a function of distance from the RF coil.

5 Claims, 3 Drawing Sheets

(56) References Cited

OTHER PUBLICATIONS

Garwood M et al: "Symmetric pulses to induce arbitrary flip angles with compensation for rf inhomogeneity and resonance offsets", Journal of Magnetic Resonance, Academic Press, London, GB, vol. 94, No. 3, Oct. 1, 1991 (Oct. 1, 1991), pp. 511-525, XP023958145, ISSN: 0022-2364, [retrieved on Oct. 1, 1991], DOI: 10.1016/0022-2364(91)90137-1.

Blumich B et al: "Mobile single sided NMR", Progress in Nuclear Magnetic Resonance Spectroscopy, Pergamon Press, Oxford, GB, vol. 52, No. 4, May 1, 2008 (May 1, 2008), pp. 197-269, XP022589395, ISSN: 0079-6565, [retrieved on Dec. 28, 2007], DOI: 10.1016/J.PNMRS.2007.10.002.

\* cited by examiner

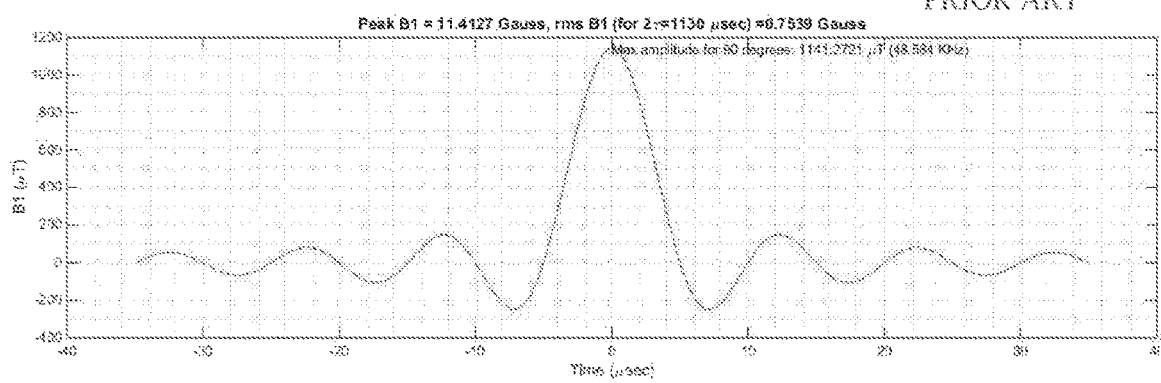
FIG. 1A
PRIOR ART
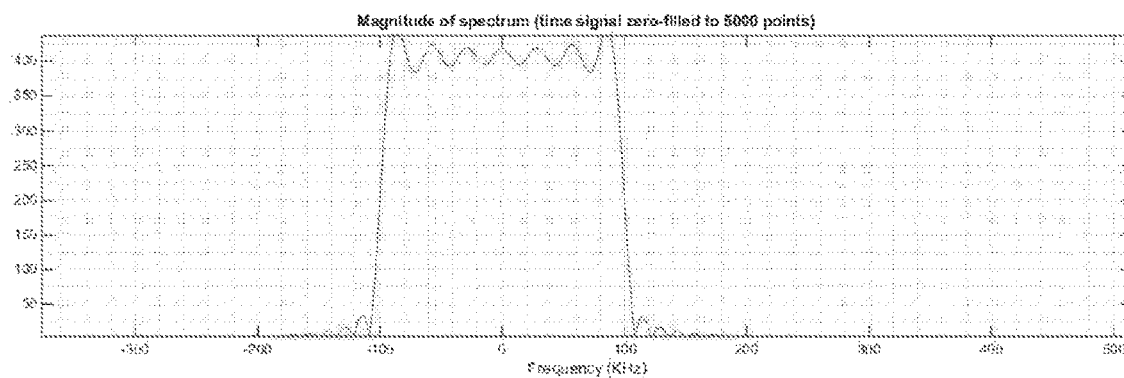
FIG. 1B - PRIOR ART
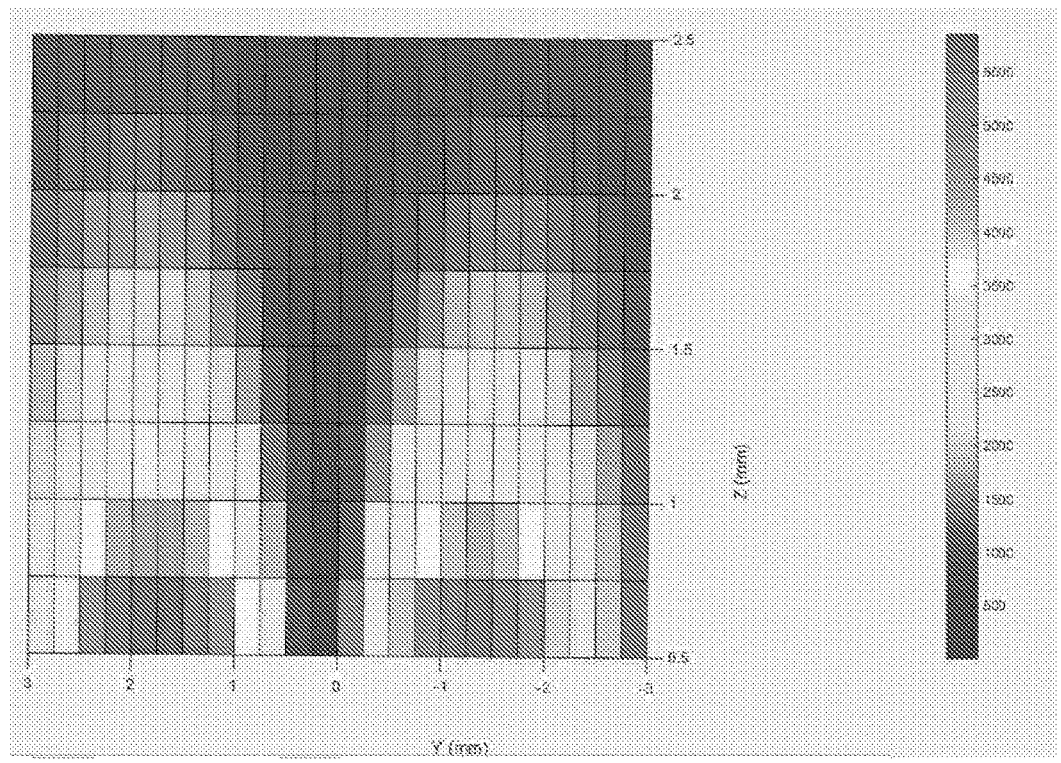
FIG. 2 - PRIOR ART

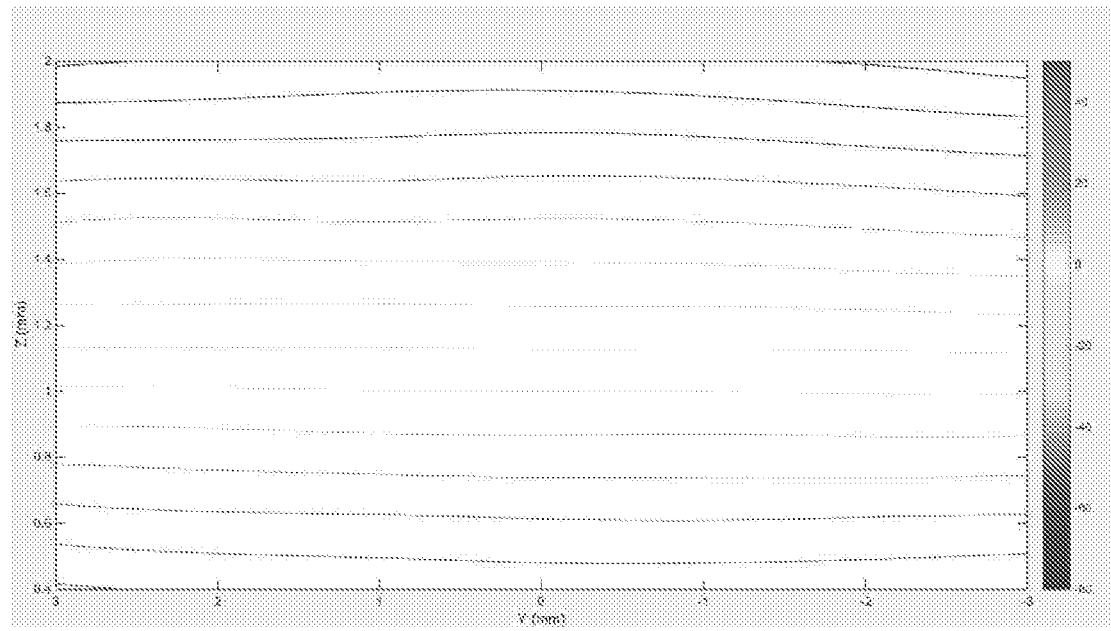
FIG. 3 - PRIOR ART
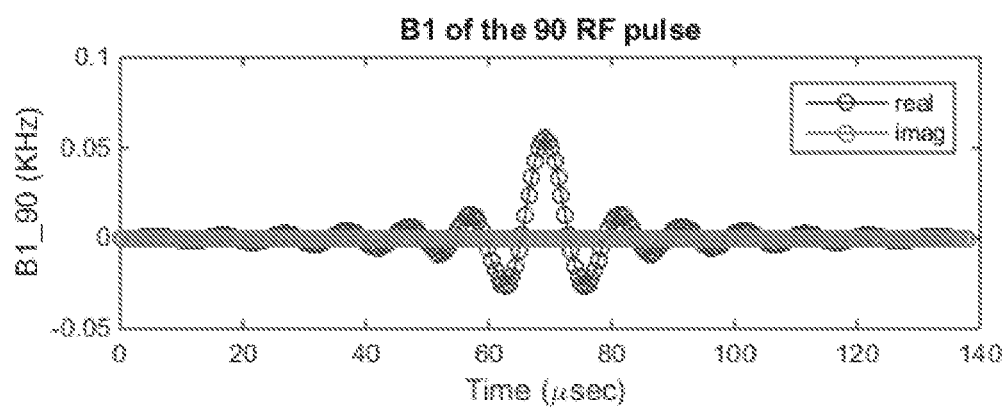
FIG. 4A
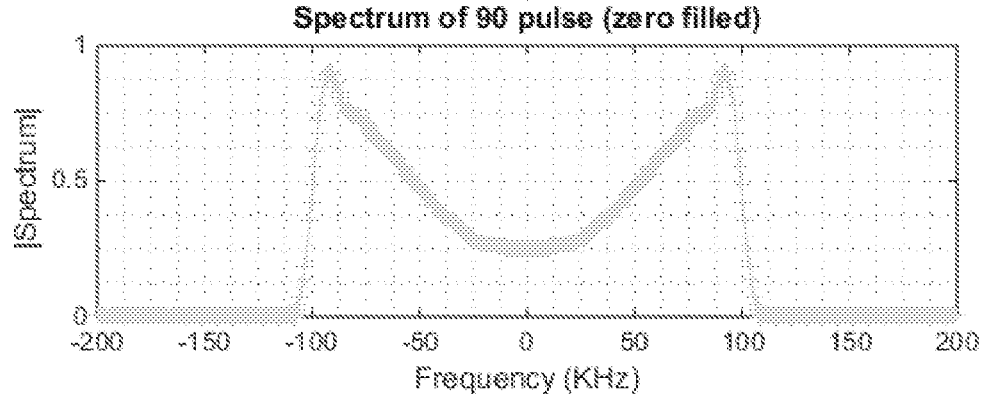
FIG. 4B

OPTIMALLY-SHAPED RF PULSE FOR MRI APPLICATIONS

FIELD OF THE INVENTION

The present invention relates generally to RF pulses used in magnetic resonance imaging (MRI) applications, and particularly to a novel scheme for shaping RF pulses for MRI applications.

BACKGROUND OF THE INVENTION

It is well known to those skilled in the art of MRI that a shaped RF pulse (for example, a pulse with a sinc-shaped envelope, as opposed to a square pulse (i.e., a so-called "hard" pulse)) can be useful in exciting signals and echoes from a desired region. For example, during the slice selection phase of a typical MRI sequence, a sinc-like RF pulse is used to excite a slice. An example of such an RF pulse envelope and its spectrum are shown in FIGS. 1A and 1B, respectively. (The actual pulse is the product of the envelope and a carrier frequency, usually set to the Larmor frequency of the spins with the gradient turned off).

It is noted that the pulse shown above has a substantially flat spectrum in the area of interest (e.g., $v_0 \pm 100$ KHz, where $v_0$ is the base frequency, usually chosen as the Larmor frequency of the spins with the gradient turned off). Although the spectrum is flat, if the above pulse is used in an MRI sequence, the magnetization it excites will not follow the spectrum but will be much closer to a Gaussian function. (This Gaussian behavior is pronounced if the flip angle is large, such as for a refocusing (180°) pulse.) This occurs because of so-called off-resonance effects which imply that the tip angle of the magnetization is proportional to the integral of the pulse only for spins on-resonance; spins that are off-resonance will rotate around an axis that has both transverse and longitudinal components, spoiling the simple relationship between pulse angle and pulse area. To overcome this (i.e., to excite a more square profile), the pulse spectrum can be shaped. One well-known algorithm for this is the so-called SLR (Shinnar-Le Roux) algorithm. In this case, the spectrum deviates from the flat shape shown above. The frequency profile is chosen to meet some user-supplied profile (typically square) as best can be, given the constraints of time and bandwidth available.

In the CLEAR SIGHT system of Clear Cut Medical Ltd., excised tissue is examined via a CPMG (Carr-Purcell-Meiboom-Gill) sequence in the presence of a strong magnetic field with a strong gradient.

In the prior art version of the CLEAR SIGHT system, RF pulses with a (truncated) sinc envelope with a substantially flat spectrum are used. However, unlike large MRI systems, which use a substantially uniform $B_1$ field in space, the $B_1$ field of the CLEAR SIGHT system's transmission antenna is inhomogeneous in space, decreasing in intensity as the distance from the coil increases. FIG. 2 illustrates the $B_1$ field of a spiral antenna like the one used in the CLEAR SIGHT system (the plane of the spiral is defined as the X-Y plane, with Z perpendicular to the plane of the antenna). It is noted that the $B_1$ field is substantially non-uniform both in the X-Y and Z directions, and that the $B_0$ field gradient is largely in the Z direction.

Thus, even if the off-resonance effect described above is ignored, the efficacy of the RF pulse in creating a spin echo needed for the CPMG sequence changes with frequency (i.e., with distance from the coil and across the X-Y plane).

SUMMARY OF THE INVENTION

The present invention seeks to provide a novel scheme for shaping RF pulses for MRI applications, as is described in detail hereinbelow.

There is provided in accordance with a non-limiting embodiment of the invention a method for shaping an RF pulse for use with an MRI system, including shaping an RF pulse for use with an MRI system that uses an RF coil, wherein the RF pulse is shaped to reduce changes in $B_1$ amplitude and in an off-resonance effect with respect to Larmor frequency as a function of distance from the RF coil.

The invention is particularly useful to optimize the NMR signal obtained in a CPMG sequence with a spiral shaped RF coil in the presence of a strong linear gradient.

BRIEF DESCRIPTION OF THE DRAWINGS

The present invention will be understood and appreciated more fully from the following detailed description, taken in conjunction with the drawings in which:

FIGS. 1A and 1B are graphical illustrations of a prior art RF pulse envelope and its spectrum, respectively;

FIG. 2 is a graphical illustration of the $B_{1(x,y)}$ field (in Tesla) vs. z of a spiral antenna like the one used in the prior art version of the CLEAR SIGHT system of ClearCut Medical Ltd., wherein x and y are in the plane of the antenna and z is perpendicular to the x-y plane;

FIG. 3 is a graphical illustration of the Larmor frequency (in MHz) vs. y and z of the spiral antenna of FIG. 2;

FIGS. 4A and 4B are graphical illustrations of an RF pulse envelope and its spectrum, respectively, in accordance with a non-limiting embodiment of the present invention, with a quadratic increase in amplitude vs frequency around the center of the spectrum.

DETAILED DESCRIPTION OF EMBODIMENTS

Reference is now made to FIGS. 4A and 4B, which illustrate an RF pulse envelope and its spectrum, respectively, in accordance with a non-limiting embodiment of the present invention.

The RF pulse is shaped to overcome two effects:

1. The change in the $B_1$ amplitude in space with Larmor frequency (i.e., with distance from the RF coil), to counteract the effect of the change in the $B_1$ field.

2. The off-resonance effect, which also changes with Larmor frequency (i.e., with distance from the RF coil), to counteract the fact that the pulse is less effective off-resonance than on-resonance.

The invention encompasses different pulses or families of pulses (with amplitude varying as a function of frequency) that optimize the NMR signal obtained in a CPMG sequence with a spiral shaped RF coil in the presence of a strong linear gradient. FIGS. 4A and 4B illustrate an example of such a pulse.

Optimization of the pulse may be done by defining the pulse frequency response and testing the efficacy at exciting magnetization using an NMR simulation. A non-limiting way of simulation is that shown in the article by Y. Zur, *An algorithm to calculate the NMR signal of an multi spin-echo sequence with relaxation and spin-diffusion*, J Magn. Reson. 171:97-106, 2004. One begins with a flat spectrum as a reference, calculating the $B_1$ pulse (i.e. $B_1(t)$) as the inverse Fourier transform of the specified frequency domain vector. Next one starts to modify the Fourier coefficients, increasing those that are most efficient at spins with lower values of the $B_1$ field (e.g. because they are farther from the antenna). Each time one modifies the spectrum, one calculates the $B_1$ pulse (i.e., $B_1(t)$) as the inverse Fourier transform of the specified frequency domain vector and tests its efficacy at exciting magnetization using an NMR simulation.

Figure 5A:
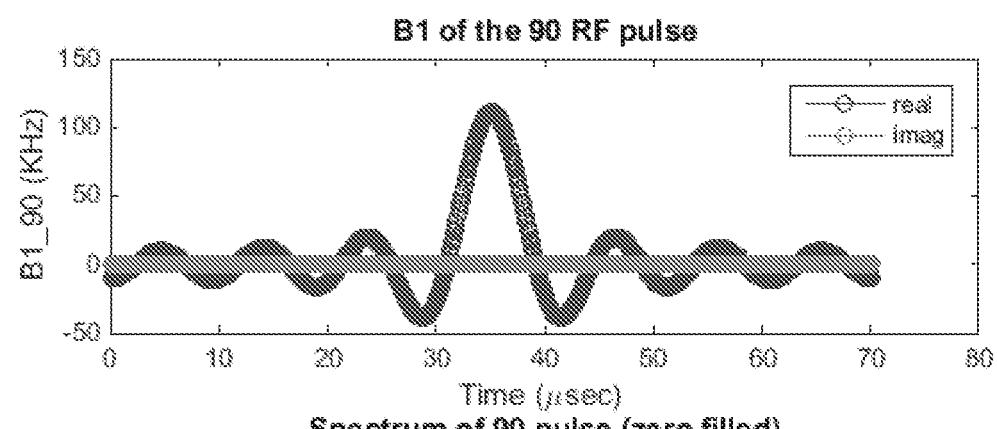
FIGS. 5A and 5B are graphical illustrations of another RF pulse envelope and its spectrum, respectively, in accordance with a non-limiting embodiment of the present invention, this time with a linear increase in amplitude vs frequency around the center of the spectrum.
Figure 5B:
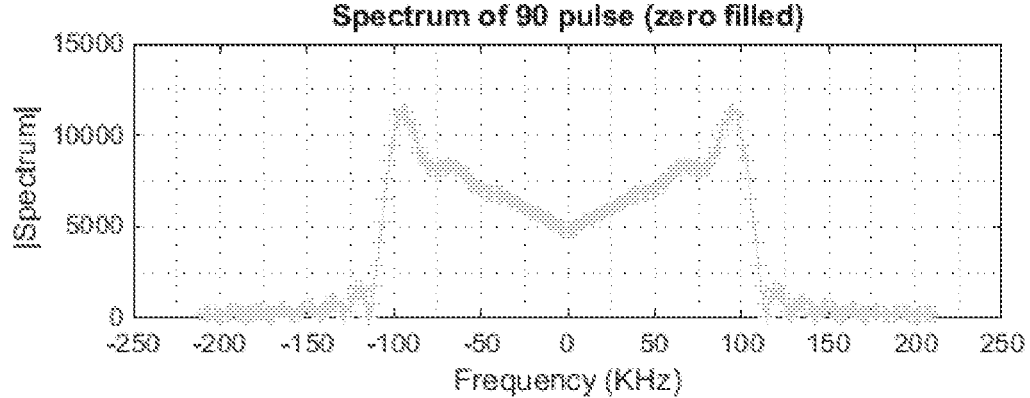

The inventors have tested increasing the amplitude vs frequency using various $B_1$ field polynomial models (linear vs offset, quadratic, etc.), and have "tweaked" the amplitude manually at individual frequencies to optimize the performance. In the pulse shown in FIGS. 4A-4B, the response is roughly quadratic vs off-resonance, while in FIGS. 5A-5B the response is roughly linear vs off-resonance. This improves the performance (as compared with the reference pulse shown in FIGS. 1A-1B) because spins at large off-resonance get "extra" energy, which compensate (at least partly) for the fact that the $B_1$ field at those positions is weaker.

Accordingly, the invention uses a pulse whose spectrum is substantially non-flat, to compensate as much as possible for the two factors mentioned above—the change of the $B_1$ field in space and the variation of the Larmor frequency in space.

The use of such an RF pulse can improve the sensitivity of the system, since the spin echo condition will be more closely obeyed at more points in the voxel under study.

What is claimed is:

1. A method for shaping an RF pulse for use with a magnetic resonance imaging (MRI) system, the method comprising:

shaping a radio-frequency (RF) pulse for use with an MRI system that uses an RF coil, wherein said RF pulse is shaped to reduce changes in $B_1$ amplitude and in an off-resonance effect with respect to Larmor frequency as a function of distance from said RF coil.

2. The method according to claim 1, wherein said RF pulse has a non-flat-shaped spectrum.

3. The method according to claim 2, wherein there is a quadratic increase in the $B_1$ amplitude versus frequency around a center of the spectrum.

4. The method according to claim 2, wherein there is a linear increase in the $B_1$ amplitude versus frequency around a center of the spectrum.

5. The method according to claim 1, wherein said RF coil comprises a spiral shaped RF coil and said MRI system uses a nuclear magnetic resonance (NMR) signal in a Carr-Purcell-Meiboom-Gill (CPMG) sequence.

* * * * *